United States Patent [19]
Dearth et al.

[11] Patent Number: 5,732,247
[45] Date of Patent: Mar. 24, 1998

[54] INTERFACE FOR INTERFACING SIMULATION TESTS WRITTEN IN A HIGH-LEVEL PROGRAMMING LANGUAGE TO A SIMULATION MODEL

[75] Inventors: Glenn A. Dearth, Groton; Paul M. Whittemore, Marlboro; David A. Medeiros, Watertown; George R. Plouffe, Jr., Bradford; Bennet H. Ih, Cambridge, all of Mass.

[73] Assignee: Sun Microsystems, Inc., Mountain View, Calif.

[21] Appl. No.: 620,439

[22] Filed: Mar. 22, 1996

[51] Int. Cl.$^6$ .................................................. G06F 9/455
[52] U.S. Cl. .................................................. 395/500
[58] Field of Search ........................... 395/500, 163.09, 395/920; 364/146, 488, 489, 490, 491, 578; 371/27.2, 27.4; 340/515

[56] References Cited

U.S. PATENT DOCUMENTS

| | | | |
|---|---|---|---|
| 5,168,441 | 12/1992 | Onarheim et al. | 364/146 |
| 5,202,889 | 4/1993 | Aharon et al. | 371/27.2 |
| 5,594,741 | 1/1997 | Kinzelman et al. | 371/27.4 |

OTHER PUBLICATIONS

Dynamic Functional Testing for VLSI Circuits Maurer, 1990

Integration of Spice With TEK LV511 ASIC Design Verification System Srivastava and Palavali, 1993.

The Apostle Simulation Language: Granularity Control And Performance Data Wonnacott and Bruce, 1996.

*Primary Examiner*—Gary Chin
*Assistant Examiner*—Dan Fiul
*Attorney, Agent, or Firm*—Richard A. Jordan

[57] ABSTRACT

An interface subsystem for use in a system including one or more simulation systems facilitates simulation of one or more simulation models under control of one or more tests. The interface subsystem allows the tests and simulation systems to transfer information therebetween and enables said tests to control the simulation systems in simulating the simulation model during a simulation run. The simulation systems include transactors which provide information to the simulation model at the beginning of a simulation run, pause a simulation run in response to detection of a selected event, and generate simulation result information. The interface subsystem includes, associated with each test, a simulation information generator, a simulation control indicator generator, and a information receiver; associated with each simulation system an information receiver associated with each transactor and a simulator interface module; and an interface core. The a simulation information generator provides simulation information to be transferred to said simulation system for use during a simulation run and the simulation control indicator generator generates a simulation control indicator for controlling said simulation system. Each test's information receiver receives simulation result information generated during a simulation run. Each simulation system's simulator interface module (a) receives simulation information and providing the received simulation to an information receiver for use by the associated transactor, (b) receives simulating result information from said at least one transactor to be provided to said at least one test, and (c) controls said at least one simulation system to initiate a simulation run in response to receipt of a control indicator. Each transactor's information receiver receives simulation information for use by the associated transactor during a simulation run. The interface core transfers (a) simulation information from a test to the simulator interface module of a simulating system for provision to one transactor's information receiver for use by a transactor during a simulation run, (b) said simulation control indicator to the simulator interface module of a simulation system for controlling the simulation system in a simulation run, and (c) simulation result information from the transactors to the tests during a simulation run.

96 Claims, 8 Drawing Sheets

FIG. 4 (CONT. A)

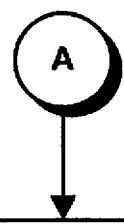

105. TEST(S) 11(T) ARE ALSO INITIALIZED AND COMMUNICATIONS ESTABLISHED BETWEEN THEM AND THE COMMUNICATIONS INTERFACE CORE 20 USING METHODOLOGY SIMILAR TO STEPS 101 THROUGH 104

106. SIMULATOR INTERFACE(S) 21 NOTIFY COMMUNICATIONS INTERFACE CORE 20 OF THEIR RESPECTIVE TRANSACTORS 15

107. COMMUNICATIONS INTERFACE CORE 20 NOTIFIES TESTS 11(T) THAT IT IS READY TO RECEIVE INFORMATION THEREFROM

108. TESTS 11(T) ISSUE RESPECTIVE HOLD CALLS TO REQUEST RESPECTIVE HOLD LOCKS

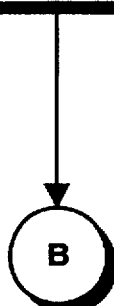

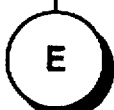

FIG. 4 (CONT. B)

109. AFTER TESTS RECEIVE HOLD LOCKS, THEY PROVIDE INFORMATION TO THE COMMUNICATIONS INTERFACE CORE 20 TO BE PROVIDED TO TRANSACTORS 15

110. COMMUNICATIONS INTERFACE CORE 20 USES RESPECTIVE LOAD MESSAGE PACKETS TO PROVIDE INFORMATION FROM TESTS 11(T) TO THE TRANSACTORS 15

111. WHEN A TEST 11(T) HAS PROVIDED ALL THE INFORMATION IT IS TO PROVIDE, IT ISSUES A SYNCHRONIZATION CALL AND PAUSES

112. WHEN ALL OF THE TESTS 11(T) HAVE ISSUED RESPECTIVE SYNCHRONIZATION CALLS, SYNCHRONIZATION CONTROL MODULE 22 ENABLES TESTS 11(T) TO RESUME PROCESSING

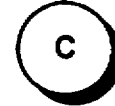

*FIG. 4 (CONT. C)*
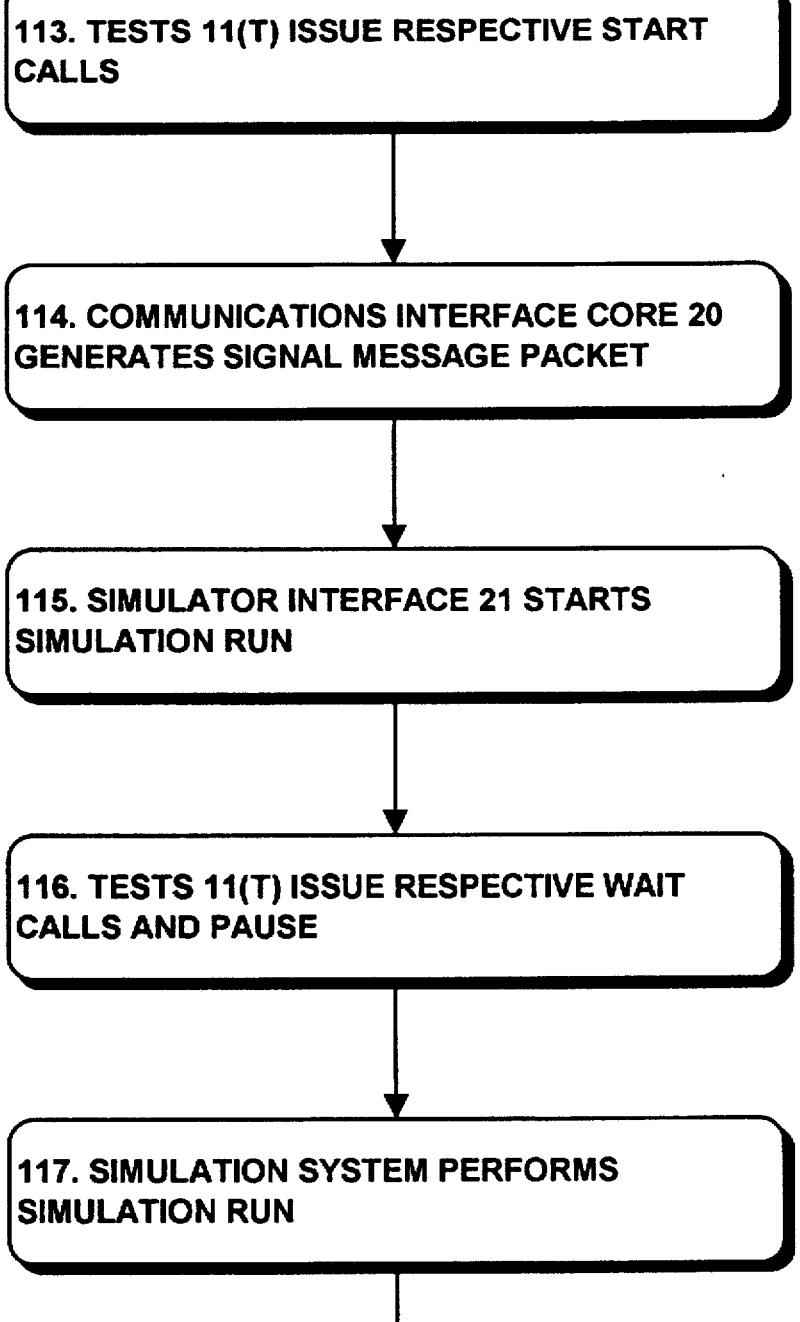

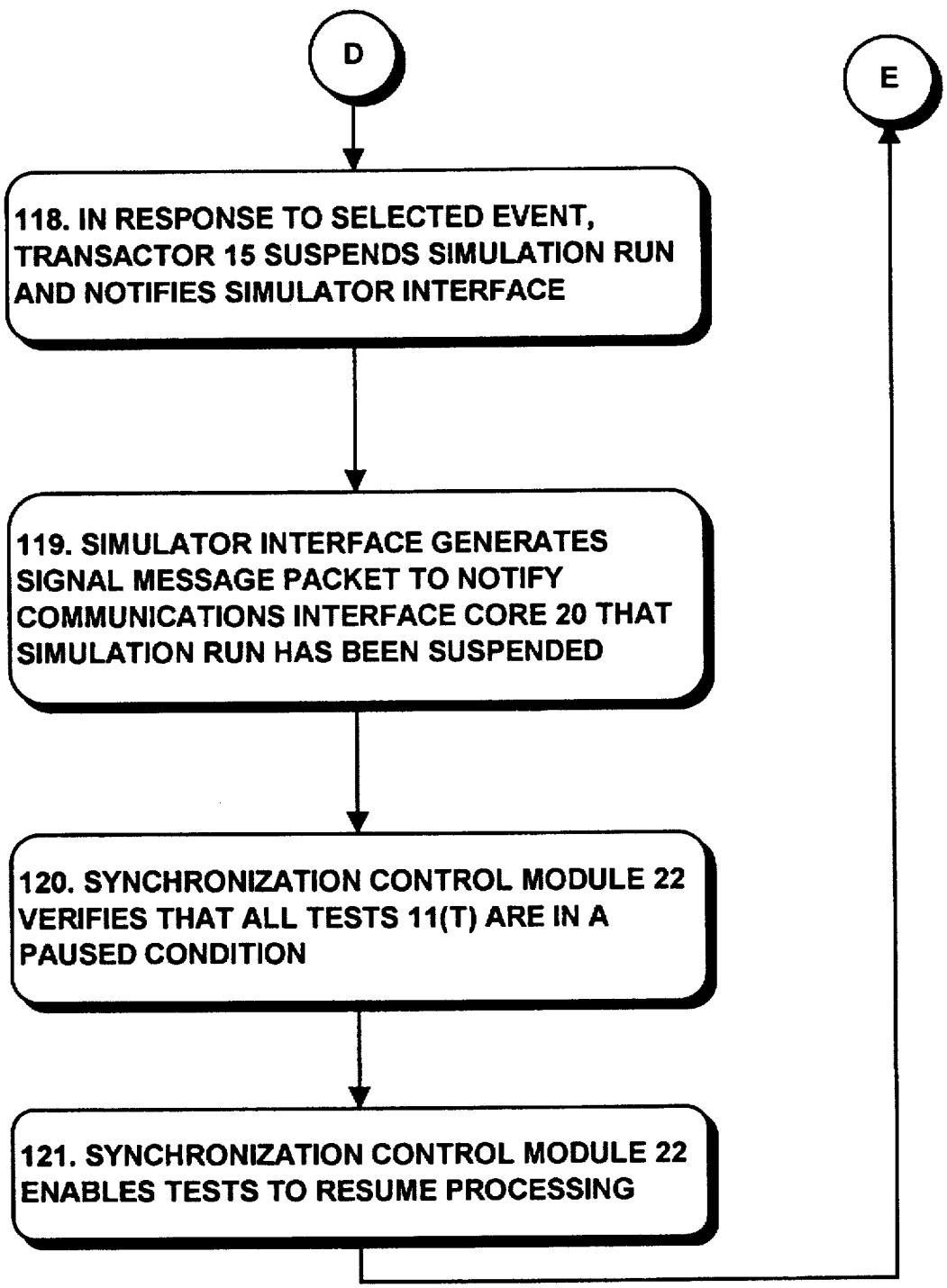
FIG. 4 (CONT. D)

INTERFACE FOR INTERFACING SIMULATION TESTS WRITTEN IN A HIGH-LEVEL PROGRAMMING LANGUAGE TO A SIMULATION MODEL

INCORPORATION BY REFERENCE

U.S. patent application Ser. No. 08/621,775, filed on even date herewith in the names of Glenn A. Dearth and Paul M. Wittemore, entitled "Virtual Bus For Distributed Hardware Simulation," incorporated herein by reference.

U.S. patent application Ser. No. 08/621,777, filed on even date herewith in the name of Glenn A. Dearth, entitled "Deadlock Avoidance Mechanism For Virtual Bus Distributed Hardware Simulation," incorporated herein by reference. U.S. patent application Ser. No. 08/621,818, filed on even date herewith in the names of Paul M. Wittemore and Glenn A. Dearth, entitled "Device Reservation Mechanism For Distributed Hardware Simulation," incorporated herein by reference.

U.S. patent application Ser. No. 08/621,776, filed on even date herewith in the names of Bennet H. Ih and Glenn A. Dearth, entitled "Object-Oriented Development Framework For Distributed Hardware Simulation," incorporated herein by reference.

U.S. patent application Ser. No. 08/621,816, filed on even date herewith in the names of Paul M. Wittemore and Glenn A. Dearth, entitled "Synchronization Mechanism For Distributed Hardware Simulation," incorporated herein by reference.

FIELD OF THE INVENTION

The invention is generally directed to the field of digital computer systems, and more particularly to the field of arrangements for simulating the functioning of integrated circuits. The invention provides a new and improved interface subsystem for use in connection with a simulation system, such as Verilog, to interface simulation tests which are written in a high-level programming language, such as "C," its derivatives and extensions, to a simulation model provided by, illustratively, Verilog.

BACKGROUND OF THE INVENTION

Electrical engineers typically design electronic circuits, such as integrated circuit chips, using circuit libraries which include definitions for standard circuit components called "cells." Using a hardware description language ("HDL"), a circuit designer will generate a detailed functional description of the desired behavior of the circuit being designed, which describes in detail the output signals to be generated by the circuit in response to input signals provided thereto. From the description, various cells to be used in the circuit are selected, and the interconnections among the selected cells are generated to define the actual circuit. Generating a design for an electronic circuit using an HDL is generally similar to generating a computer program for execution by a computer, except that the HDL's that are used are typically specialized to the field of electronic circuit design.

After a design has been developed for the circuit, and preferably before the circuit has actually been implemented, the design will be simulated, using the description provided by the designer, to verify that it will operates in a correct manner. A number of systems are available for simulating the operations of an electronic circuit design using an HDL description of the circuit, one such system comprising the well-known Verilog system. The simulation tests which are used in verification will generally not be designed by the circuit designer; typically, simulation tests will be designed by verification engineers who specialize in designing such tests. The simulation tests can be constructed using the HDL in which the circuit was designed.

However, as noted above, HDL's are typically specialized, and it would be advantageous to allow verification engineers to generate verification tests used to simulate a circuit design using better-known programming languages, such as high-level programming languages which are generally used in programming computers.

SUMMARY OF THE INVENTION

The invention provides a new and improved interface for use in connection with a simulation system, such as Verilog, particularly to interface simulation tests which are written in a high-level programming language, such as "C," its derivatives and extensions, to a simulation model provided by, illustratively, Verilog.

In brief summary, in one aspect the invention provides an interface subsystem for use in a system including one or more simulation systems to facilitate simulation of one or more simulation models under control of one or more tests. The interface subsystem allows the tests and simulation systems to transfer information therebetween and enables said tests to control the simulation systems in simulating the simulation model during a simulation run. The simulation systems include transactors which provide information to the simulation model at the beginning of a simulation run, pause a simulation run in response to detection of a selected event, and generate simulation result information. The interface subsystem includes, associated with each test, a simulation information generator, a simulation control indicator generator, and a information receiver; associated with each simulation system an information receiver associated with each transactor and a simulator interface module; and an interface core. The simulation information generator provides simulation information to be transferred to said simulation system for use during a simulation run and the simulation control indicator generator generates a simulation control indicator for controlling said simulation system. Each test's information receiver receives simulation result information generated during a simulation run. Each simulation system's simulator interface module (a) receives simulation information and providing the received simulation to an information receiver for use by the associated transactor, (b) receives simulating result information from said at least one transactor to be provided to said at least one test, and (c) controls said at least one simulation system to initiate a simulation run in response to receipt of a control indicator. Each transactor's information receiver receives simulation information for use by the associated transactor during a simulation run. The interface core transfers (a) simulation information from a test to the simulator interface module of a simulating system for provision to one transactor's information receiver for use by a transactor during a simulation run, (b) said simulation control indicator to the simulator interface module of a simulation system for controlling the simulation system in a simulation run, and (c) simulation result information from the transactors to the tests during a simulation run.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4, 4A, 4B, 4C and 4D is a flow chart depicting illustrative operations performed by the interface depicted in FIG. 1 during a simulation.

DETAILED DESCRIPTION OF AN ILLUSTRATIVE EMBODIMENT

Figure 1:
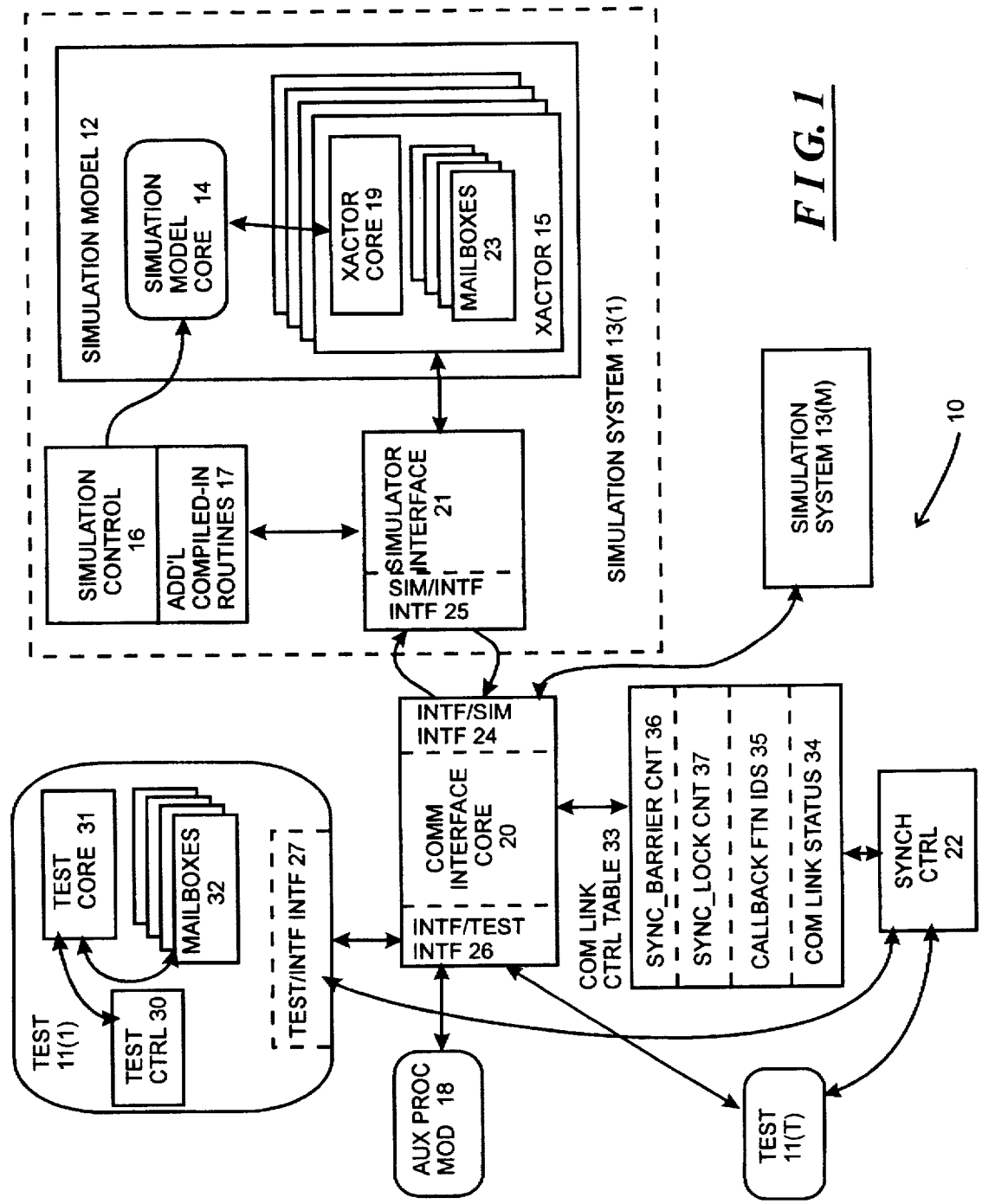
FIG. 1 is a functional block diagram of a system including an interface subsystem for interfacing tests for controlling simulations of electronic circuits developed in a high-level programming language to simulation models provided by simulation systems based on functional descriptions in a hardware description language, constructed in accordance with the invention.

FIG. 1 is a functional block diagram of a system 10 for enabling one or more simulation tests 11(l) through 11(T) (generally identified by reference numeral 11(t)) to simulate one or more simulation models, one of which is depicted in FIG. 1 and identified by reference numeral 12. In one embodiment, the system 10 will be implemented by one or more suitably-programmed general-purpose digital computer systems, although it will be appreciated that system 10 can be constructed in whole or in part from special purpose hardware and/or a combination of special purpose hardware and one or more general purpose computer systems, any portion of which may be controlled by a suitable program. The simulation models 12 are provided by one or more simulation systems 13(l) through 13(M) (generally identified by reference numeral 13(m)) based on a functional description of a digital circuit which is developed by a circuit designer. In one embodiment, the simulation tests 11(t) are preferably written in a conventional high-level programming language, which may include, for example, C or a derivative or extension of C, such as the object-oriented extension C++. In that same embodiment, the functional description as generated by a circuit designer is in the form of a conventional hardware description language ("HDL") description which is typically used to describe the detailed functioning of the digital circuit being designed, including the particular circuit elements to be used and their interconnections. The HDL description is also used to generate a simulation model, such as simulation model 12, for use in simulating the circuit's operations. In one embodiment, the simulation system 13 simulates the operations of an integrated circuit and makes use of the conventional Verilog simulation system for simulating the operations of an integrated circuit design.

As noted above, the simulation system 13(m) provides one or more simulation models 12, based on the HDL description of the circuit design provided by a circuit designer. Each model 12 includes a model core portion 14 and one or more transactors 15. The model core portion 14 of model 12 effectively represents the HDL description. As is conventional, an HDL description describes the functioning of the circuit being designed in response to input signals, and during a simulation session, the description is processed through one or more ticks of a clocking signal to provide output signals, with both the input and output signals being represented by, for example, numerical values which may represent, for example, amplitudes of voltages and/or electric currents which the simulation system 13(m) determines are present at various locations in the circuit representation. Typically the transactors 15 are provided to perform a number of operations. For example, transactors 15 provide mechanisms for providing input values to the model core 14 under simulation and to provide output values for the tests 11(t) at selected points in time or in response to selected events, which events may be determined based on control input information which is also provided through ones of the transactors 15. Transactors 15 may also enable a simulation session to pause in response to the occurrence of selected events and enable the tests 11(t) to be notified that the simulation session has been paused. Further, transactors 15 may, during a simulation session, request selected processing by auxiliary processing modules 18 which may be provided by a circuit designer or test developer externally of the simulation system 13(m), either as part of a test 11(t) or separately therefrom. Each transactor includes a transactor core 19 and one or more mailboxes generally identified by reference numeral 23. The transactor core 19 interfaces to the simulation model core 14 and controls provision of input values and control information thereto, receives output values, and determines when the simulation session is to be paused and the tests 11(t) are to be notified. As will be described below in greater detail, the mailboxes 23 provide a mechanism by which information can be provided to the transactor core 19 and received therefrom.

In addition, the simulation system 13(m) includes a simulation control module 16, which in one embodiment corresponds to the Verilog simulation system. The simulation control module 16 effectively exercises the simulation model core portion 14 using the input values provided through the transactors 15 and the respective ticks of the clocking signal to generate output values which are provided through the transactors associated with various output points in the circuit design represented by the simulation model core portion 14. The simulation control module 16 may also be provided with one or more additional routines, generally identified by reference numeral 17 which may extend the functionality of the Verilog simulation system represented by module 16. Typically, the additional routines 17 are compiled with the simulation control module 16 and form part thereof, to perform or initiate operations which, for example, Verilog itself may not provide as well as in enhancement of functions which Verilog does provide.

The tests 11(t) also generally provide the initial input values which are representative of those to be provided to the various digital circuit models 12 to be simulated, and receive output values which are representative of the output values generated during the simulation session. The tests 11(t) may verify correct operation by, for example, comparing the output values to output values which would be expected if the model, when simulated, were operating in a manner intended by the designer. The circuit designer may use this information in determining whether the digital circuit as designed is appropriate for the device, if any, in which the circuit will be used. In addition, the circuit designer may use the information in determining whether and how the circuit design may be improved. The tests 11(t) may each include a test core portion 31 and a test control portion 30, and will include one or more mailboxes generally identified by reference numeral 32. Generally, the test core portion 31 will define the particular test to be performed, defining in particular the various input values to be provided at particular points in the simulation session. The test control portion 30 will effectively control and synchronize communications with the interface core 20. The mailboxes 32 provide mechanisms by which the tests 11(t) receive output values which are generated during a simulation session or by which the tests 11(t) can provide input values which may be requested by a transactor 15.

Before proceeding further, it would be helpful to generally describe operations performed by the tests 11(t) and a simulation system 13(m) during a simulation session. Generally, a simulation session proceeds in a number of iterations or "runs." During each run, one or more tests 11(t) will provide input values to the simulation system 13(m), in particular enabling the input values to be loaded into particular mailboxes 23 of particular ones of the transactors 15 for use by their respective transactor cores 19. After all of the tests 11(t) have provided the input values, one of the tests will enable the simulation run to start. In response, the simulation control 16 will begin a simulation run. During a simulation run, one or more of the transactors 15 (in particular the respective transactor cores 19) may request information from one or more of the tests 11(t), which information will be obtained from respective ones of the tests' mailboxes 32. In addition, during a simulation run, one or more of the transactors 15 (in particular, the respective transactor cores 19) may request auxiliary processing by one or more of the auxiliary processing modules 18. In response to such an auxiliary processing request, the auxiliary processing module 18 that is to process the request will perform selected processing operations in connection with information which may be provided by the transactor 15 which issued the auxiliary processing request or by other sources which may be identified by the transactor 15 which issued the auxiliary processing request, to generate information which may be provided to one or more of the transactors 15. Furthermore, during a simulation run one or more of the transactors 15 (in particular, the respective transactor cores 19) may enable information to be loaded into one or more of the tests' mailboxes 32.

These operations will continue until one of the transactors encounters a condition which enables it to pause the simulation run, at which point the simulation run will terminate. At that point, the tests 11(t) may be notified that the simulation run has been paused and the above-described operations repeated through another iteration. The simulation run may proceed through a number of iterations until the tests 11(t) determine that the simulation session is to be terminated, at which point the simulation session will end.

The system 10 provides an arrangement by which the tests 11(t) and transactors 15 can effectively transfer input, output, control and status information therebetween, by which the tests 11(t) can enable a simulation system 13(m) to run, by which the transactors 15 can request auxiliary processing, and by which tests 11(t) can be synchronized in providing input information and enabling a simulation run to start. This arrangement is provided by a number of elements, including an communications interface core 20, a simulator interface 21 associated with each of the simulation systems 13(m), mailboxes 23 provided for and comprising part of the transactors 15, mailboxes 32 provided for and comprising part of the tests 11(t), and a synchronization control module 22. Generally, the communication interface core 20, using a communication link control table 33, regulates communications between itself and the simulation systems 13(m) and tests 11(t), providing a mechanism by which tests 11(t) can provide information to the simulation systems 13 (m) for use in their simulations and obtain simulation results therefrom. The synchronization control module 22, which also makes use of the communication link control table 33, synchronizes the tests 11(t) in providing input information and in enabling a simulation run to start. In one embodiment, the communication link control table 33 is in the form of a number of tables, each of which includes communication link control information for one of the tests 11(t) or simulation systems 13(m). (The simulation systems 13(m) and tests 11(t) may also be provided with tables which contain communication link control information for use by them in communicating with the communications interface core 20.)

More specifically, the communications interface core 20 regulates communications with the tests 11(t) and the simulator interfaces 21 of the various simulation systems 13(m) to transfer input values from the tests 11(t) for use by the various simulation models 12 maintained by simulation systems 13(m) to be simulated, to receive output values generated during the various simulations and transfer them to the tests 11(t), and to selectively start the simulation runs for of the various simulation models 12 by the respective simulation systems 13 (m). The communications mechanism used by the communications interface core 20 and the simulator interfaces 21 of the various simulation systems 13(m) will be described below in connection with FIGS. 1 and 2. The communications mechanism allows multiple tests 11(t) to control a single simulation session in connection with a simulation model 12, thereby providing an arrangement whereby a number of tests 11(t) can effectively appear as multiple threads of a single test. The mechanism by which the synchronization control module 22 and tests 11(t) synchronize communications between the tests 11(t) and simulation system 13(m) to ensure that simulation results are repeatable as among different simulation runs, as will be described below in connection with FIG. 3. As indicated above, both the communications interface core 20 and the synchronization control module 22 make use of the communication link control table 33, which includes a variety of types of information such as (i) communication link control and status information in a field 34 which indicates the identifications and status of various communication links established between the communications interface core 20 and the respective simulator interfaces 21 and tests 11(t), identifications of various host computers (not shown) which may be running respective tests 11(t) and simulation systems 13(m), and the like, (ii) callback function identification information in a field 35 which enables the tests 11(t) and simulator interfaces 21 to regulate how they can be communicated with in response to selected occurrences, such as the receipt by the communications interface core 20 of particular types of communications, and (iii) synchronization control information in fields 36 and 37 which the synchronization control module 22 may use in synchronizing the tests 11(t) in providing input information and in enabling a simulation run to start.

In one embodiment, communication interface core 20 provides default callback function identification information in field 35, but each test 11(t) and simulator interface 21 may substitute its own callback function identification information as described below.

The simulator interface 21 of a simulation system 13(m) controls communications between the communications interface core 20, on the one hand, and the various simulation models 12 and the simulation control module 16 and additional compiled in routines 17 to provide input values to the simulation models 12, to control the simulation control module 16 and additional routines 17 and to receive output values generated by the simulation models 12 to be provided to the various tests 11(t). The mailboxes 23 provide the mechanism by which the simulator interface 21 provides information to the transactors 15, in particular the mechanism by which a test 11(t), through the communications interface core 20 and simulator interface 21, provides input values to respective transactors 15 and the mechanism by which it (that is, the simulator interface 21) receives output values from respective transactors 15. The mailboxes 23 are provided by the developer of the model as part of the model 12. Like the additional routines 17, the simulator interface 21 is compiled with the simulation control module 16.

The communications interface core 20 and the respective simulator interfaces 21 of the various simulation systems 13(m) communicate using message packets that in one embodiment are transferred through respective interfaces, including an interface/simulation interface 24, which forms part of the communications interface core 20, and respective simulation/interface interfaces 25, each of which forms part of each simulator interface 21. In addition, the tests 11(t) communicate with the communications interface core 20 using similar message packets through an interface/test interface 26, which also forms part of the communications interface core 20, and respective test/interface interfaces 27, each of which forms part of a test 11(t). A number of diverse communications procedures may be used by the respective interfaces 24 through 27. In one embodiment, in which tests 11(t), the simulation system 13(m) and the communications interface core 20 are in separate processes, the interfaces 24 through 27 transfer information using a suitable interprocess communications mechanism, in particular a conventional remote procedure call ("RPC") techniques. However, if a test 11(t) and/or a simulation system 13(m) forms part of the same process as the communications interface core 20, other suitable intra-process communications mechanisms can be used. In the embodiment in which RPC communications techniques are used, the respective interfaces 24 through 27 provide a bi-directional communications by providing RPC "client" and "server" facilities in both directions. That is, for example, to facilitate communications between the interface/simulator interface 24 and simulator/interface interface 25:

(i) the interface/simulator interface 24 will include an RPC client and the simulator/interface interface 25 will include an RPC server, to facilitate communications from the communications interface core 20 to the simulator interface 21, and (ii) the simulator/interface interface 25 will include an RPC client, and the interface/simulator interface 24 will include an RPC server, to facilitate communications from the simulator interface 21 to the communications interface core 20.

Similarly, to facilitate communications between the interface/test interface 26 and the test/interface interface 27:

(i) the interface/test interface 26 will include an RPC client and the test/interface interface 27 will include an RPC server, to facilitate communications from the communications interface core 20 to the test 11(t), and (ii) the test/interface interface 27 will include an RPC client, and the interface/test interface 2 will include an RPC server, to facilitate communications from the test 11(t) to the communications interface core 20.

If an intra-process communication mechanism is used between a test 11(t) and simulation system 13(m), on the one hand, and the communications interface core 20, on the other hand, either a single bi-directional communication arrangement or two uni-directional communication arrangement providing communications in opposing directions may be advantageously used. Each auxiliary processing module 18 will include an interface similar to the test/interface interface 27 to facilitate communications between the communications interface core 20 and the respective auxiliary processing module 18.

The respective pairs of interfaces 24 and 25, on the one hand, and 26 and 27, on the other hand, provide arrangements by which each of communications interface core 20 and simulator interfaces 21 (in the case of interfaces 24 and 25) and each of communications interface core 20 and tests 11(t) (in the case of interfaces 25 and 26) can transmit message packets to the other and receive return information which may comprise control and/or status information. For example, the communications interface core 20, using its interface/simulator interface 24, can issue a remote procedure call to a simulator interface 21 to transmit message packets to the simulator interface 21 to control the simulator interface 21 to, for example, load input values into respective mailboxes 23 and initiate a simulation run. The RPC return information provided by simulator interface 21 in response to messages it (that is, the simulator interface 21) receives from the communications interface core 20 may include, for example, status information concerning the condition of the simulation system, in particular indicating whether it is running or stopped.

Similarly, the simulator interface 21, using its simulator/interface interface 25, can issue an RPC call to the communications interface core 20 to transmit a message packet thereto. This may occur in response to selected events, including, for example, that the simulation run has proceeded for a selected time, that a particular pause condition exists, to enable processing by an auxiliary processing module 18, or to initiate a retrieval of information from or loading of information into one or more selected mailboxes 32 of one or more tests 11(t). For example, in response to the occurrence of a selected event the simulation system 13(m) is to provide simulation state information to a test 11(t). At that point, the simulation interface 21 will retrieve the information from the mailboxes 23 for transmission, in one or more message packets, to the communications interface core 20 for provision to the test 11(t). In response to the remote procedure call from the simulator interface 21, the communications interface core 20 provides an RPC response which may enable the simulation control 16 to resume with the simulation run, or alternatively may enable the simulation control 16 to suspend the simulation run until it receives a subsequent start indication from the communications interface core 20.

Similarly, if a transactor 15 determines that a processing operation is to be performed by an auxiliary processing module 18, it will enable the simulator interface 21, using its simulator/interface interface 25, to issue an RPC call to the communications interface core 20 to, in turn, enable the auxiliary processing module 18 to perform the processing operation and, as the RPC response, provide the result of the processing operation. When the simulator interface 21 receives the RPC response, it will provide the result to the transactor 15. In addition, if a transactor 15 determines that information is required from a mailbox 32 of a test 11(t), it will enable the simulator interface 21, using its simulator/interface interface 25, to issue an RPC call to the communications interface core 20 to, in turn, retrieve the information from the particular mailbox 32, and, as the RPC response, provide the information thereto (that is, to the simulator interface 21). When the simulator interface 21 receives that RPC response, it will provide the information (that is, the information retrieved from the mailbox 32) to the transactor 15.

Similarly, each test 11(t), using its test/interface interface 27, can issue an RPC call to the communications interface core 20 to enable information to be stored in respective mailboxes 23 of a simulation model 12 and system 13(m) and to enable a simulation run to start. The RPC response, may include such information as the status of the simulation run, such as whether the simulation run successfully started or whether it was running when the test issued the RPC call to enable information to be stored in a mailbox 23. As will be described below, in one embodiment the tests 11(t) can enable information to be stored in the mailboxes 23 of a simulation model 12 only when not running, and a new simulation run will not be started until all of the tests 11(t) which are to provide information to the simulation model 12 have provided their information. These limitations are provided to ensure that, if a simulation run is repeated with the same inputs from the tests, the same output results will be provided. The synchronization control module 22 cooperates with the tests 11(t) to enforce these limitations.

In one embodiment, there are a number of types of message packets which the communications interface core 20 and simulator interface 21 may transmit through their respective interfaces 24 and 25, and which the communications interface core 20 and tests 11(t) may transmit through their respective interfaces. These message packets include a null packet type, a probe packet type, a signal packet type, a slave packet type, a load packet type, a read packet type, and a register packet type. Several packet types, including the null packet type and probe packet type, are used to control communications between the interfaces 24 through 27. Other packet types, including the signal packet type, slave packet type, load packet type, and read packet type, are used to transmit information for or from the respective mailboxes 23 and 32, and control information to enable the simulation run to start, stop and be suspend. Finally, the register packet type is used by the tests 11(t) and the transactors 15(t) to notify each other and the communications interface core 20 of their existence. All of these packet types have the same general structure, which will be described below in connection with FIG. 2.

More specifically, message packets of the null packet type are used to test whether the other interface is operational. Messages of the probe packet type are used to establish, synchronize and shut down the communication links between the interfaces 24 and 25, which allows the communications interface core 20 and simulator interface 21 to transmit message packets to each other, and interfaces 26 and 27, which allow communications interface core 20 and tests 11(t) to transmit message packets to each other.

Messages of the signal packet type are used to control a simulation system 13(m) and to report its status. The communications interface core 20 will use a message packet of the signal packet type to enable the simulator interface 21 to, in turn, enable the simulation control to begin a simulation run. On the other hand, the simulator interface 21 will use a message packet of the signal packet type to notify the communications interface core 20 and tests 11(t) that certain events had occurred in the simulation run. The simulator interface 21 may use a message packet of the signal packet type to notify the communications interface core 20 or a test 11(t) that, for example, it had received an interrupt indication or an indication that a clock tick had occurred in the simulation run, or an indication that a transactor 15 had loaded an output in its mailbox 23. Messages of the slave packet type are used by the simulator interface 21 in response to a request from a transactor for auxiliary processing by an auxiliary processing module 18.

Messages of the load packet type are used to load information in the various mailboxes 23 and 32. In particular, the communications interface core 20 or a test 11(t) will use a message packet of the load packet type to provide the simulator interface 21 with information, provided by the test 11(t), which the simulator interface 21 will load into a particular transactor's mailbox 23 which is identified in the message packet. This may be used, for example, to provide initial values for the transactors 15 to use during the simulation run. Similarly, the simulator interface 21 will use a message packet of the load packet type to provide the communications interface core 20 with an output value that it receives from a mailbox 23 for transmission to a mailbox 32 in the test 11(t). Message packets of the load packet type generated by a test 11(t) will include a identifiers identifying the simulation system 13(m), transactor 15 and mailbox 23 into which the information in the message packet is so be loaded. Similarly, message packets of the load packet type generated by a simulation system 13(m) will include identifiers identifying the test 11(t), resources (if any) such as data structures and other objects which are maintained by the test 11(t), and mailboxes 32 which are associated with those resources, into which the information in the message packet is to be loaded.

Messages of the read packet type are used by the communications interface core 20 and simulator interface 21 to retrieve the current contents of the various mailboxes which are accessible by the other interface. That is, the communications interface core 20 or a test 11(t) may use a message packet of the read packet type to enable the simulator interface 21 to retrieve the contents of a mailbox 23 which is maintained by a transactor 15 of the simulation model 12. This may be used, for example, at the beginning of a simulation run to enable a test 11(t) to verify that a correct value was loaded into a mailbox 23 in response to a message packet of the load packet type, and at the end of a simulation run to enable a test 11(t) to retrieve contents of mailboxes 23 that were not otherwise provided by the simulator interface 21 by means of a message packet of the load packet type. The simulator interface 21 may also use a message packet of the read packet type to enable the communications interface core 20 to retrieve contents of a mailbox 32 which is maintained by the test 11(t). This may be used by the simulator interface 21 to, for example, provide information requested by a transactor 15 during a simulation run. Message packets of the read packet type generated by a test 11(t) will include a identifiers identifying the simulation system 13(m), transactor 15 and mailbox 23 from which information is to be retrieved. Similarly, message packets of the load packet type generated by a simulation system 13(m) will include identifiers identifying the test 11(t), resources (if any) such as data structures and other objects which are maintained by the test 11(t), and mailboxes 32 which are associated with those resources, from which information is to be retrieved.

Message packets of the register packet type are used by each of the communications interface core 20 and simulator interface 21 to register resources with the other of the interfaces 21 and 20. The simulator interface 21 uses a message packet of the register packet type to notify the communications interface core 20 of the various transactors 15 which are maintained by a simulation model 12.

As indicated above, the communications interface core 20 also provides a mechanism, by means of callback functions, by which a test 11(t) and a simulator interface 21 can enable and regulate how the communications interface core 20 communicates with them in response to selected occurrences, such as the receipt by it (that is, the communications interface core 20) of particular types of communications. Each test 11(t) and simulator interface 21 can provide the identification of a callback function, which is stored in field 35 of the communication link control table 33 (FIG. 1) which identifies a function to be called by the communications interface core 20 if the core 20 receives certain message packets of certain types. A test 11(t) or simulator interface 21 may provide particular identifiers for particular functions to be called if the communications interface core 20 receives a message packet of, for example, the signal, receive, and load packet types, from a simulation system 13(m), thereby to enable the test itself to control how the communications interface core 20 will perform the call.

Figure 2:
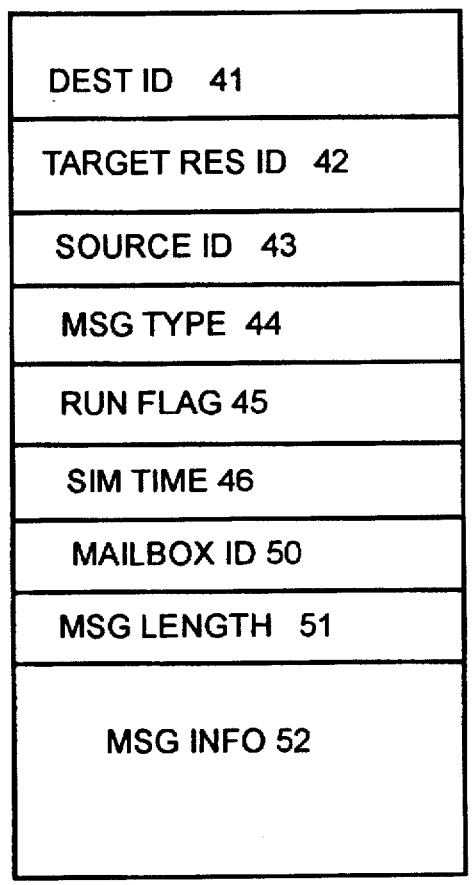
FIG. 2 depicts the structure of message packets which are used by various elements of the interface which is depicted in FIG. 1.
Figure 3:
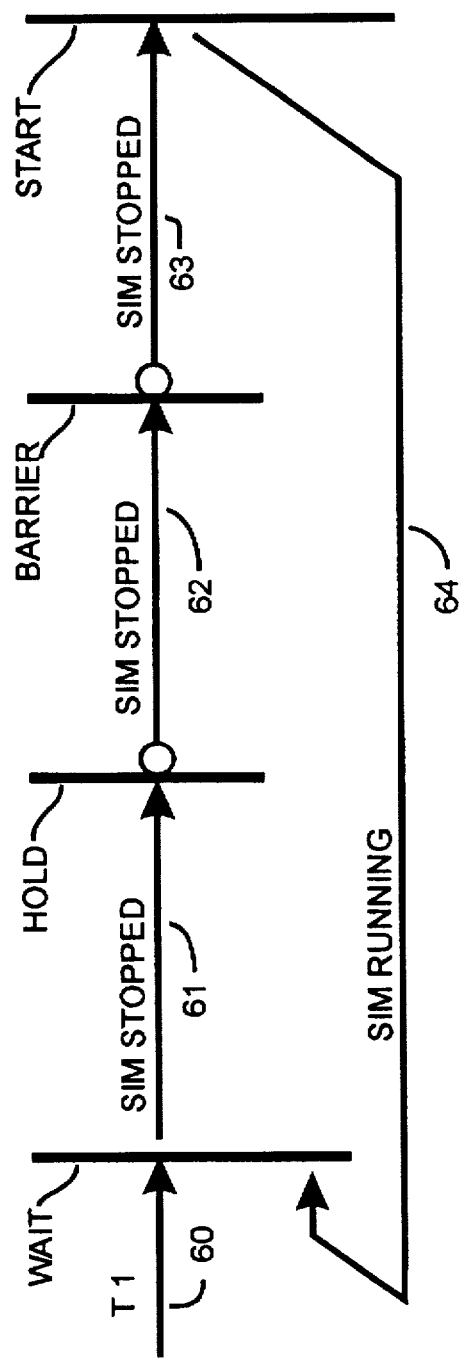
FIG. 3 is a diagram useful in understanding the operation of a synchronization mechanism provided by the interface depicted in FIG. 1, to synchronize communications between a number of tests, all of which are to control a particular simulation provided by a simulation system, and the simulation to be controlled.

With this background, the structure of the message packet will be described in connection with FIG. 2. As described above, message packets of all of the various types have the same general structure. With reference to FIG. 2, a message packet, identified in FIG. 2 by reference numeral 40, includes a number of fields. Several of the fields, including a destination identifier field 41, a target resource field 42, a source identifier field 43 and a message type field 44 are used to control the routing of message packets between the communications interface core 20 and test interfaces 27 of tests 11(t), on the one hand, and the simulator interfaces 21 and the simulation models' transactors 15 of the various simulation systems 13(m), on the other hand. Other fields, in particular a run flag 45 and a simulation time field 46, provide simulation control and simulation status information. Finally, other fields, namely, a mailbox identifier field 50, a message information length field 51, and a message information field 52, contain the information to be passed in the message, which may include, for example, information be loaded into a particular mailbox or retrieved from a particular mailbox 23 or 32 identified in the mailbox identifier field 50. It will be appreciated that the information to be loaded into the respective fields of a message packet 40 to be transmitted by the communications interface core 20 to the simulator interface 21 of a particular simulation system 13(m) will generally be provided to the communications interface core 20 by the various tests 11(t). Similarly, the information to be loaded into the respective fields of a message packet 40 to be transmitted by the simulator interface 21 of a particular simulation system 13(m) to the communications interface core 20 will generally be provided to the simulator interface 21 by the transactors 15 through their mailboxes 23.

More specifically, the destination identifier field 41 identifies the destination of the message packet. In a message packet generated by the communications interface core 20, the destination identifier field 41 may identify, for example, the particular simulation system 13(m) for which the message packet 40 is intended. Alternatively, in a message packet generated by the simulation interface 21 of a simulation system 13(m), the destination identifier field 41 may identify the communications interface core 20 or the particular test 11(t) for which the message packet 40 is intended.

The target resource identifier field 42 may be used to identify a particular resource at the destination identified by the destination identifier field 41. For example, in message packets 40 provided by the communications interface core 20, the target resource identifier field 42 may identify a particular transactor 15 for which the message packet is intended. On the other hand, in message packets 40 provided by the simulator interface 21 of a simulation system 13(m), the target resource identifier field 42 may identify a particular resource (if any) such as a data structure or other object of the test 11(t) for which the message packet 40 is intended.

The source identifier field 43 identifies the source of the message packet 40, and may also be used to identify a source of the information contained in the message packet 40. In message packets 40 provided by the communications interface core 20, the source identifier field 43 may identify the communications interface core 20, and may also identify the particular test 11(t) which provided information for the message packet 40 and which enabled the communications interface core 20 to generate the message packet 40. On the other hand, in message packets 40 provided by the simulator interface 21 of a simulation system 13(m), the source identifier field 43 may identify the simulator interface 21 and/or simulation system 13(m), as well as the particular simulation model 12 and mailbox thereof which provided the information in the message packet 40. In addition, if the message packet 40 was generated in response to information provided by the simulation control module 16 or an additional routine 17, the source identifier field 43 may identify the module 16 or routine 17 in the source identifier field 43.

The message type field 44 identifies the particular type of message packet, in particular identifying the message packet as being of the null packet type, the probe packet type, the signal packet type, the slave packet type, the load packet type, the read packet type, and the register packet type.

The run flag field 46 contains a run flag which is used, in a message packet from the communications interface core 20 to the simulator interface 21 of a simulation system 13, to control the running of a simulation system 13(m). If the run flag of a run flag field 46 of a message packet 40 from the communications interface core 20 has a selected condition (illustratively identified herein as a set condition), the simulator interface 21 of the simulation system 13(m) which receives the message packet 40 can enable the simulation control 16 to, in turn, begin or resume the simulation run for the simulation model 12 identified by the target resource field 42. However, if the run flag has another selected condition (illustratively identified herein as a clear condition), the simulator interface 21 of the simulation system 13(m) which receives the message packet 40 can enable the simulation control 16 to suspend running of the simulation system 13(m) identified by the destination identifier field 41.

The simulation time field 47 in message packets from the simulator interface of a simulation system 12 provides a running simulation time value provided by the simulation control module 16.

The mailbox identifier field 50 identifies a particular mailbox 23 of the simulation system 13(m) and transactor 15 that are identified in fields 41 and 42, or a particular mailbox 32 for the resource of the test 11(t) that is identified in fields 41 and 42. The message information length field 51 identifies the amount of information contained in message information field 52. The particular type of information in the message information field 52 of a message packet 40 will depend on the message packet's packet type. In the case of, for example, a signal message, the information in field 52 may comprise a signal to enabling the simulator interface 21 of the simulation system 13(m) which receives the message packet to start a simulation run, or a signal notifying the communications interface core 20 that a simulation run has been suspended. In the case of a message packet of the load packet type, the information in field 52 may comprise information to be loaded into the mailbox 23 or 32 identified by mailbox identifier field 50. If a mailbox 23 or 32 includes multiple locations in which information may be loaded, the mailbox address field 50 may also identify a particular location in the mailbox 23 or 32 into which the information is to be loaded. In the case of a message packet 40 of the slave packet type, the information in the message information field may contain information to be used by the auxiliary processing module 18 during its processing. In the case of a message packet 40 of the probe packet type, the information in the message information field 52 will comprise information useful in establishing and synchronizing the RPC link of the particular element which generates and transmits the message packet, and/or shutting the RPC link down.

As noted above, the system 10 also provides a synchronization control module 22 which allows the various tests 11(t) to be synchronized as among the various simulation session. As indicated above, a number of tests 11(t) may be controlling a simulation model 12 concurrently, that is, they may be responsible for loading information into selected ones of the mailboxes 23 for a simulation model 12, and controlling the starting of the simulation run. The tests 11(t) and synchronization control module 22 provide a synchronization mechanism, which will be described in connection with FIG. 3, using a combination of a barrier synchronization mechanism and a hold/start locking mechanism, which will ensure that all of the tests 11(t) which are to provide information, in particular input values, for a particular simulation run will do so prior to starting of each simulation run. The synchronization mechanism ensures that, if a simulation session is repeated, using the same simulation model 12 and the same tests 11(t), the same results will be generated even though the information provided to control the various simulation runs are provided by a number of independently-operating tests 11(t).

The synchronization mechanism used by the tests 11(t) and the synchronization control module 22 makes use of a number of synchronization calls to control synchronization, including a wait call, a hold call, a synchronization call, a start call, and a release call. When a simulation run is started, the tests 11(t) which are controlling the simulation run will effectively suspend their operations, waiting for the simulation system 13(m) to issue a "signal" indicating that the simulation run had ended, which may be indicated by the receipt by the communications interface core 20 of a message packet of the signal packet type from the simulator interface 21 of the simulation system 13(m). In one particular embodiment, the tests 11(t) are implemented as independently-threaded execution streams, and the operations of tests 11(t) are suspended by pausing their respective execution streams. Such tests 11(t), initially proceeding along a precessing stream represented by the arrow identified by reference numeral 60, will issue respective wait calls, which the synchronization control module 22 will receive, which in turn results in the tests' respective execution streams being paused, as represented by the vertical bar labeled "WAIT." When the communications interface core 20 receives a signal from the simulator interface 21, after determining that the execution streams of all of the tests 11(t) are in a paused condition, it (that is, the communications interface core 20) will enable the processing of the execution stream for the tests 11(t) which issued the wait call for that particular signal to be resumed.

After processing of a test's execution stream is resumed, as represented by an arrow identified by reference numeral 61, it will issue a hold call, as represented by the vertical bar labeled "HOLD" if it needs to provide information to a simulation model 12, in particular to load information into mailboxes 23 of the simulation model 12. The synchronization control module 22, in response to the hold call, initiates the hold/start locking mechanism, and will not allow the tests 11(t) to start a simulation run or until all tests whose execution streams were resumed and which issued respective hold calls get an opportunity to load information into the simulation model 12. The synchronization control module 22, in response to a hold call from a test 11(t) will provide a hold lock to the test 11(t), which notifies it (that is, the test 11(t)) that it may provide information for loading into the simulation model 12, as indicated by the arrow identified by reference numeral 62. In addition, when the synchronization control module 22 provides a hold lock to a test 11(t), it (that is, the synchronization control module 22) will increment the synchronization barrier count in field 36 of the communication link control table 33. It will be appreciated that, in providing information to be loaded into the simulation model 12, the test 11(t) will provide to the communications interface core 20 information which, in turn, it (that is, the communications interface core 20) may provide in one or more message packets of the load packet type to the simulator interface 21 of the simulation system 13(m) which maintains the particular simulation system 13(m) to be controlled, as described above in connection with FIGS. 1 and 2, as represented by the arrow identified by reference numeral 63. In one embodiment, the communications interface core 20 may concurrently issue hold locks to any number of the tests 11(t), so that they may concurrently provide information for the simulation model 12, and at any particular point in time, the synchronization barrier count in field 36 will indicate the number of tests 11(t) which have hold locks.

After the test 11(t) has finished providing the information to be provided to the simulation model 12, it (that is, the test 11(t)) will return the hold lock to the synchronization control module 12 to indicate that it has finished, and will also issue a synchronization call. When the test 11(t) returns the hold lock, the synchronization control module 22 will decrement the synchronization barrier count in field 36 of the communication link control table 33. The synchronization call operates as a barrier, and the test 11(t) which issued the synchronization call will effectively pause operations. After all of the tests 11(t) have returned their hold locks, which will be indicated by the synchronization barrier count in field 36 being decremented to zero, and have issued their synchronization calls, the synchronization control module 22 will enable the tests 11(t) to resume operations, as represented by the arrow identified by reference numeral 63.

After a test 11(t) has resumed, it may issue the start call. When the synchronization control module 22 receives the first start call from a test 11(t), it will enable that test 11(t) to initially pause in its operations, and in addition will increment the synchronization lock count value in field 37 of the communication link control table 33. On the other hand, when the synchronization control module 22 receives the subsequent start calls from respective tests 11(t), it (that is, the synchronization control module 22) will enable those tests 11(t) to continue processing, as represented by the arrow identified by reference numeral 64, issue their respective wait calls, and pause execution at the vertical bar labeled "WAIT." In addition, the synchronization control module 22 will increment the synchronization client count field in the field 37 of the communication link control table 33.

After all of the tests 11(t) have issued their respective start calls, as indicated by the synchronization lock count value in field 37 corresponding to the number of tests 11(t) which are controlling the particular simulation model 13(m), the synchronization control module 22 will enable the first test 11(t) which issued the start call to resume processing, and in that operation will provide the start lock to that test 11(t). After the test 11(t) receives the start lock, it (that is, the test 11(t)) can enable the simulation run to be started. Thereafter, the test 11(t) will continue processing, as represented by the arrow identified by reference numeral 64, issue its wait call, and pause execution at the vertical bar labeled "WAIT."

Thus, by using the sequence of wait, hold, synchronization and start calls, and ensuring that operations of all tests 11(t) are paused in response to respective wait calls before any of the tests resume operations in response to a signal from the simulation system 13(m), the tests 11(t) and synchronization control module 22 can ensure that all tests 11(t) with information to be provided to a simulation system 13(m) for a simulation run can do so before the simulation run is started. This helps ensure that a series of simulation runs is repeatable, since it ensures that, for a particular simulation run in a series of runs which comprises one simulation session, all of the tests will be providing the same information as for the same simulation run in the series for another simulation session.

It will be appreciated that, if a particular test 11(t) does not have information to load into a simulation model 12 for a particular run, after the synchronization control module 22 enables the test 11(t) to resume processing after it (that is, the test 11(t)) issues the wait call, it (that is, the test 11(t)) may issue the synchronization call directly, and pause operations at the vertical line labeled "BARRIER." At that point, the operations may proceed in connection with such test 11(t) as described above. In addition, as noted above the synchronization mechanism includes a release call, which a test 11(t) may use, after it has a hold lock, to release the hold lock if it does not intend to provide information to be loaded into the simulation model 12.

Figure 4:
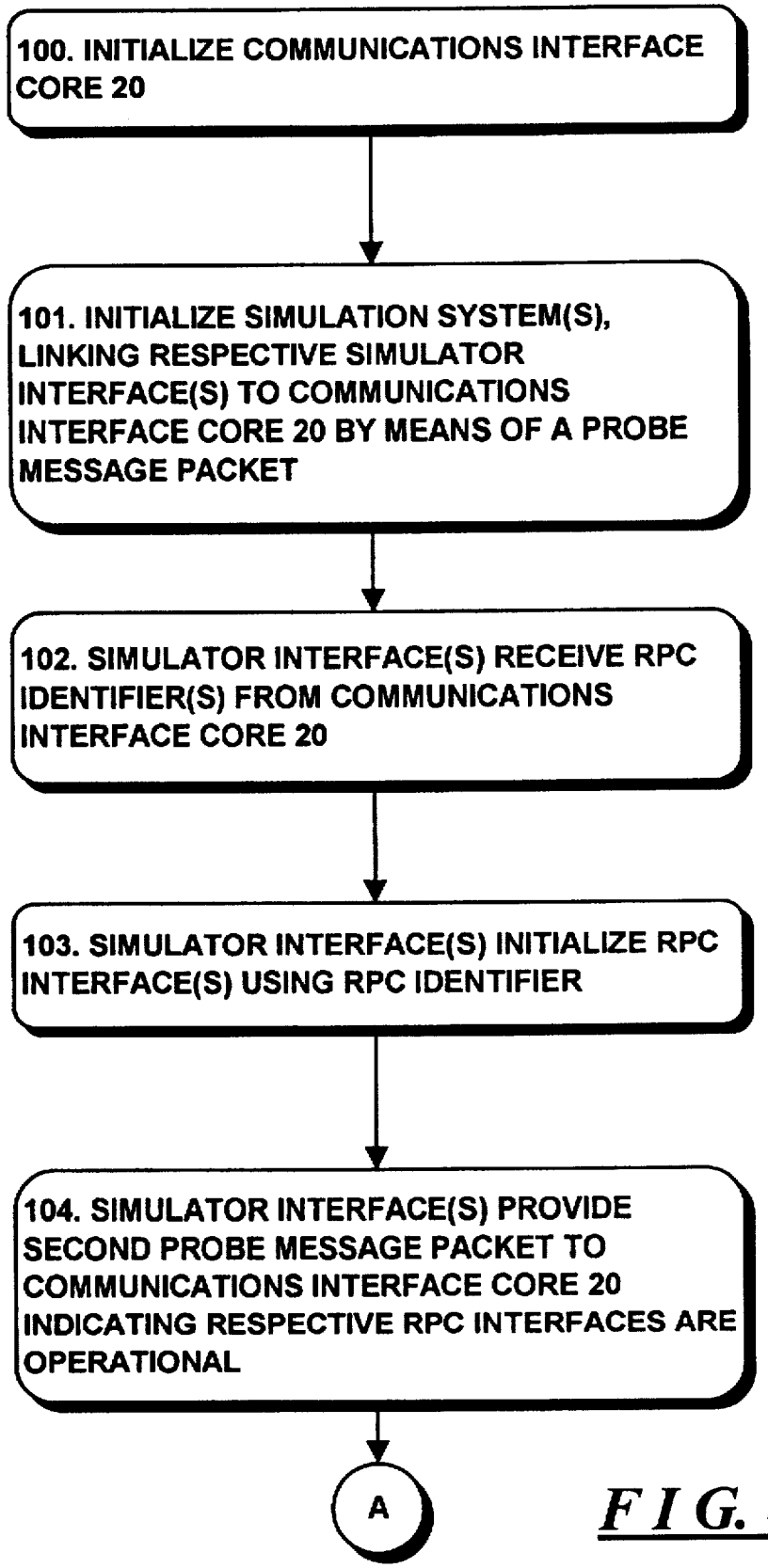

With this background, the operations performed by the system 10 will be described in connection with FIG. 4. Preliminarily, preferably the communications interface core 20 will be initialized prior to other elements of the system depicted in FIG. 1 (step 100). As each of the simulation systems 13(m) is initialized, its simulator interface 21 will be linked to the communications interface core 20 by means of a message packet of the probe packet type (step 101). In the message packet of the probe packet type, the simulator interface 21 will provide an identifier which the communications interface core 20 can use as an RPC identifier in calls made by the communications interface core 20 to the simulator interface 21, and the communications interface core 20 will also provide in response an identifier to the simulator interface for use in subsequent communications with it (step 102). Thereafter, the simulator interface 21 will initialize its RPC interface 25 using the RPC identifier from the communications interface core 20 (step 103) and will issue a second message packet of the probe packet type (step 104) to indicate to the communications interface core 20 that its (that is, the simulator interface's) RPC interface 25 is operational to receive RPC calls from the communications interface core 20. In addition, the simulator interface 21 may use the second message packet of the probe packet type to notify the communications interface core 20 of the identifications of any callback functions to be used.

In addition, tests 11(t) will be initialized and communications established between respective tests 11(t) and the communications interface core 20 (step 105). In one embodiment, the tests 11(t) communicate with the communications interface core 20 using RPC calls, and using message packets of types described above in connection with FIG. 2, and so communications between the tests 11(t) and the communications interface core 20 can be initialized in the same manner as with the simulation systems 13(m), as described above in connection with steps 101 through 104. It will be appreciated that the tests 11(t) and simulator interfaces 21 may initialize communications with the communications interface core 20 generally concurrently, and so step 105 in connection with the tests 11(t) may be performed generally concurrently with steps 101 through 104 in connection with the simulator interfaces 21. A test 11(t), concurrent with or subsequent to initializing communications with the communications interface core 20, may also provide callback function information that the communications interface core 20 will use in response to communications that it (that is, the communications interface core 20) receives from a simulator interface 21 as described above.

After communications have been established between a simulator interface 21 and the communications interface core 20, the simulator interface 21 may register various resources, in particular its various transactors 15 of the simulation model(s) 12 maintained by the simulation interface's simulation system 13(m), with the communications interface core 20 (step 106). In that operation, the simulator interface 21 may make use of message packets of the registration packet type, as described above. Various ones of the simulator interfaces 21 may register their transactors 15 while communications are being established between the communications interface core 20 and others of the simulator interfaces 21, and also while communications are being established between the communications interface core 20 and tests 11(t) (step 105, above).

Following registration (step 106, above), the communications interface core 20 will notify the tests 11(t) that it is ready to receive information from them (step 107). Thereafter, the tests 11(t) have the opportunity to provide information to be loaded into the transactors 15, utilizing the synchronization sequence described above in connection with FIG. 3. In particular, the tests 11(t) which are to provide information to one or more of the transactors 15 can issue respective hold calls to the synchronization control module 22 to request respective hold locks (step 108), and after they receive the hold locks can provide information to the communications interface core 20 (step 109), which, in turn, uses one or more message packets of the load packet type to transfer the information to the respective transactors 15 (step 110). When each test 11(t) has finished providing the information to be provided, it issues the synchronization call and pauses (step 111 ). When all of the tests 11(t) have issued respective synchronization calls, the synchronization control module 22 will enable the tests 11(t) to resume processing (step 112). At some point thereafter, the tests 11(t) will issue respective start calls, as described above in connection with FIG. 3 (step 113) to enable the communications interface core to, in turn, generate a message packet of the signal packet type (step 114) to enable the simulator interface 21 to start the simulation run (step 115). The tests 11(t) will also issue respective wait calls, to enable them to pause in their operations (step 116).

Following step 115, the simulation system 13(m) will be performing the simulation (step 117). While the simulation run is proceeding, the transactors 15 may enable the simulator interface 21 to generate one or more message packets of the read packet type to enable information to be retrieved from respective mailboxes 32 of respective tests 11(t) for use by the transactors 15 during the simulation run. In addition, the transactors 15 may enable the simulator interface 21 to generate one or more message packets of the load packet type to enable information to be transferred from mailboxes 23 in the simulation model 12 to the communications interface core 20, which, in turn, can transfer the information to the mailboxes 32 of the respective tests. It will be appreciated that, for tests 11(t) which have provided callback function identifiers to the communications interface core 20 for use in connection with message packets of the load or read packet type, it (that is, the communications interface core 20) will use those callback functions in communicating with the respective tests 11(t).

In response to the occurrence of a selected event during the simulation run, a transactor 15 will suspend the simulation run and notify the simulator interface (step 118). In response, the simulator interface 20 may generate a message packet of the signal packet type to notify the communications interface core 20 that the simulation run has been suspended (step 119). The synchronization control module 22 will verify that all of the tests 11(t) are in a paused condition (step 120), and if so will enable the tests 11(t) to resume processing (step 121), using a callback function for a test 11(t) if the test provided a callback function identifier for use in connection with message packets of the signal packet type. At that point, operations will return to step 108 and to enable the mailboxes 23 to be reloaded and/or the simulation run resumed. It will be appreciated that these operations may be repeated through a number of iterations, as determined by the various tests 11(t).

The system 10 described above in connection with FIGS. 1 through 4 provides a number of advantages. For example, it allows for a separation between the simulation systems 13(m) and simulation models which are to be simulated and the tests 11(t) which control the respective simulation models. It allows the simulation models to be represented by respective HDL models which are defined using a hardware description language, while the tests 11(t) are defined using a conventional high-level computer programming language. As a result, the test developers who develop the various tests 11(t) need not be familiar with the often-arcane details of hardware description languages which are used to define the simulation models 12.

In addition, as a further benefit of the separation of the simulation systems 13(m) and the tests 11(t), the simulation systems 13(m) may be persistent, that is, the simulation system 13(m) and simulation models can remain in computer memory and can be used by some of the tests 11(t) even as other tests 11(t) are being modified.

In addition, the system provides an arrangement which simplifies addressing to facilitate the transfer of information between tests and simulation models. In particular, a test, to transfer information to a particular transactor's mailbox, need merely identify the particular simulation system 13(m), transactor 15 and mailbox 23 to receive the information. In addition, the transactors 15, to transfer information to a particular test's resource and mailbox 32, merely identify the particular test 11(t), resource and mailbox 32 to receive the information.

Furthermore, since the system provides a synchronization arrangement by which multiple tests 11(t) can control a single simulation system 13(m), the system allows for a simplified development of complex, multi-threaded tests while ensuring that the tests are repeatable.

It will be appreciated that numerous modifications may be made to the system described above in connection with FIGS. 1 through 4. For example, while the communications interface core 20 and simulator interfaces 21 are described as using communicating by means of RPC calls, any convenient communications arrangements may be used to transfer information therebetween. Similarly, any convenient arrangements, including RPC calls, may be used to facilitate communications between the tests 11(t) and the communications interface core 20, and between the simulation control module 16, additional routines 17 and simulation model 12, on the one hand, and the simulator interface 21 of the respective simulation system 13(m), on the other hand.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. For use in a system including at least one simulation system for facilitating simulation of at least one simulation model under control of at least one test, an interface subsystem for allowing said at least one test and said at least one simulation system to transfer information therebetween and for enabling control by said at least one test of said simulation system in simulating said simulation model during a simulation run, said at least one simulation system including at least one transactor for (a) providing information to said simulation model to control the simulation model, (b) pausing a simulation run in response to detection of a selected event, and (c) generating simulation result information, said interface subsystem comprising:

A. each said at least one test including a simulation information generator for providing simulation information to be transferred to said simulation system for use during a simulation run and a simulation control indicator generator for generating a simulation control indicator for controlling said simulation system, each said at least one test further having associated therewith at least one information receiver for receiving simulation result information;

B. each said at least one simulation system including:
      i. associated with said at least one transactor, an information receiver for receiving simulation information for use by the associated transactor during a simulation run;
      ii. a simulator interface module associated with each said at least one said simulation system for (a) receiving simulation information and providing the received simulation to an information receiver for use by the associated transactor, (b) receiving simulating result information from said at least one transactor to be provided to said at least one test, and (c) controlling said at least one simulation system to initiate a simulation run in response to receipt of a control indicator; and C. an interface core for transferring (i) said simulation information from said at least one test to the simulator interface module of a selected one of said at least one simulating system for provision to a selected one of said at least one of said transactor's information receiver for use by a transactor during a simulation run, (ii) said simulation control indicator for controlling a selected one of said at least one simulation system, and (iii) for transferring said simulation remit information from said at least one transactor to said information receiver of a selected one of said at least one test.

2. An interface subsystem as defined in claim 1, in which the at least one simulation model is in the form of a hardware description language description of an electronic circuit.

3. An interface subsystem as defined in claim 1 in which the at least one test is defined by a computer program product in the form of a high-level computer programming language.

4. An interface subsystem as defined in claim 1 in which said information receiver of said at least one test comprises a mailbox.

5. An interface subsystem as defined in claim 1 in which said information receiver of said at least one transactor comprises a mailbox.

6. An interface subsystem as defined in claim 1 in which said interface core provides at least one bi-directional information transfer link to each of said at least one test and each of said at least one simulator interface module.

7. An interface subsystem as defined in claim 6 in which at least one of said at least one bi-directional information transfer link comprises two uni-directional information transfer links for transferring information in opposite directions.

8. An interface subsystem as defined in claim 6 in which each said uni-directional information transfer link comprises a remote procedure call link.

9. An interface subsystem as defined in claim 1 in which said at least one said test generates said simulation information in the form of at least one simulation information message packet, said simulation information message packet including simulation system identification information identifying one of said at least one simulation system to receive the simulation information message packet.

10. An interface subsystem as defined in claim 7 in which each said at least one simulation system has an associated simulation system identifier, said simulation system identification information in each said simulation information message packet identifying the simulation system identifier of the at least one simulation system to receive the simulation information message packet.

11. An interface subsystem as defined in claim 9 in which said simulation information message packet further includes transactor identification information for identifying one of said at least one transactor to receive the simulation information in said simulation information message packet.

12. An interface subsystem as defined in claim 11 in which each at least one transactor has an associated transactor identifier, said transactor identification information in each said simulation information message packet identifying the transactor identifier of the at least one transactor to receive the simulation information in said simulation information message packet.

13. An interface subsystem as defined in claim 11 in which at least one said transactor has a plurality of associated information receivers each identified by an information receiver identifier, said simulation information message packet further including information receiver identification information for identifying one of said plurality of information receivers to receive the simulation information in said simulation information message packet.

14. An interface subsystem as defined in claim 1 in which said at least one said transactor generates said simulation result information in the form of at least one simulation result information message packet, said simulation result information message packet including test identification information identifying one of said at least one test to receive the simulation result information message packet.

15. An interface subsystem as defined in claim 14 in which each said at least one test has an associated test identifier, said test identification information in each said simulation information message packet identifying the test identifier of the at least one test to receive the simulation result information message packet.

16. An interface subsystem as defined in claim 14 in which at least one said test has a plurality of associated information receivers each identified by an information receiver identifier, said simulation result information message packet further including information receiver identification information for identifying one of said plurality of information receivers to receive the simulation information in said simulation information message packet.

17. An interface subsystem as defined in claim 1 further comprising a simulation information control module for controlling the simulation information generator of said at least one test.

18. An interface subsystem as defined in claim 17 in which said simulation information control module enables said simulation information generator to provide simulation information for said at least one simulation system when said simulation system is not engaged in a simulation run.

19. An interface subsystem as defined in claim 18 in which said simulation information control module disables said simulation information generator from providing simulation information for said at least one simulation system when said simulation system is engaged in a simulation run.

20. An interface subsystem as defined in claim 1 in which said at least one transactor during a simulation run generates supplemental information requests requesting supplemental simulation information from said at least one test, said interface core transferring said supplemental information request so said at least one test to obtain said supplemental simulation information therefrom.

21. An interface subsystem as defined in claim 1 in which said at least one test includes a mailbox for storing supplemental simulation information, the interface core in response to a supplemental information request from said at least one transactor retrieving said supplemental simulation information from said mailbox for provision to said at least one transactor.

22. An interface subsystem as defined in claim 1 further including at least one auxiliary processing module for performing an auxiliary processing operation, said at least one transactor generating an auxiliary processing request, said simulator interface module in response to an auxiliary processing request enabling said interface core to enable said auxiliary processing module to perform said auxiliary processing operation.

23. An interface subsystem as defined in claim 22 in which said auxiliary processing module during an auxiliary processing operation generates auxiliary processed information, the interface core providing said auxiliary processed information to the simulator interface module of said at least one simulation system for provision to said at least one transactor.

24. An interface subsystem as defined in claim 1 further comprising a plurality of tests, each including a simulation information generator for providing simulation information to be transferred to said test for use during a simulation run and a simulation control indicator generator for generating a simulation control indicator for controlling said simulation system, said interface subsystem further including a simulation control synchronization module for synchronizing the tests in providing respective simulation information and simulation control indicators to the at least one simulation system.

25. An interface subsystem as defined in claim 24 in which the simulation control synchronization module enables the tests to provide simulation information to said at least one simulation system prior to a simulation run.

26. An interface subsystem as defined in claim 25 in which said simulation control synchronization module further enables one of the tests to provide a simulation control indicator after all of the tests which are to provide simulation information for a simulation run have provided simulation information.

27. An interface subsystem as defined in claim 1 in which said at least one test provides at least one callback mechanism, said interface core using said callback mechanism in transferring said simulation result information to said information receiver.

28. An interface subsystem as defined in claim 27 in which callback mechanism is identified by a callback identifier, said at least one test providing said callback identifier to said interface core, the interface core using said callback identifier to initiate use of said callback mechanism.

29. An interface subsystem as defined in claim 28 in which said interface core provides an information transfer link to said at last one test, said interface core and said at least one test each including an information transfer link establishment module for establishing said information transfer link, said at least one test using the information transfer link establishment module to provide the callback identifier.

30. An interface subsystem as defined in claim 1 in which said at least simulation system provides at least one callback mechanism, said interface core using said callback mechanism in transferring said simulation result information to said information receiver.

31. An interface subsystem as defined in claim 30 in which callback mechanism is identified by a callback identifier, said at least one simulation system providing said callback identifier to said interface core, the interface core using said callback identifier to initiate use of said callback mechanism.

32. An interface subsystem as defined in claim 31 in which said interface core provides an information transfer link to said at last one simulation system, said interface core and said at least one simulation system each including an information transfer link establishment module for establishing said information transfer link, said at least one simulation system using the information transfer link establishment module to provide the callback identifier.

33. For use in a system including at least one simulation system for facilitating simulation of at least one simulation model under control of at least one test, an interface subsystem computer program product for use in connection with a computer to allow said at least one test and said at least one simulation system to transfer information therebetween and for enabling control by said at least one test of said simulation system in simulating said simulation model during a simulation run, said at least one simulation system including at least one transactor for (a) providing information to said simulation model to control the simulation model, (b) pausing a simulation run in response to detection of a selected event, and (c) generating simulation result information, said interface subsystem computer program product comprising a computer readable medium having thereon:

A. each said at least one test including simulation information generator code devices for enabling said computer to provide simulation information to be transferred to said test for use during a simulation run and simulation control indicator generator code devices for enabling said computer to generate a simulation control indicator for controlling said simulation system, each said at least one test further having associated therewith information receiver code devices for enabling said computer to receive simulation result information;

B. each said at least one simulation system including:
  i. associated with said at least one transactor, information receiver code devices for enabling said computer to receive simulation information for use in connection with the associated transactor during a simulation run;
  ii. simulator interface code devices associated with each said at least one said simulation system for enabling said computer to (a) receive simulation information and provide the received simulation to a transactor's information receiver for use by the associated transactor, (b) receive simulation result information from said at least one transactor to be provided to said at least one test, and (c) control said at least one simulation system to initiate a simulation run in response to receipt of a control indicator; and C. interface core code devices for enabling said computer to transfer (i) said simulation information from said at least one test for processing in response to the simulator interface code devices for a selected one of said at least one simulating system for provision to a selected one of said at least one of said transactor's information receiver code devices for use by a transactor during a simulation run, (ii) said simulation control indicator for controlling a selected one of said at least one simulation system, and (iii) for transferring said simulation result information from said at least one transactor for processing by said computer in response to information receiver code devices associated of a selected one of said at least one test.

34. An interface subsystem as defined in claim 33, in which the at least one simulation model is in the form of a hardware description language description of an electronic circuit.

35. An interface subsystem as defined in claim 33 in which the at least one test is defined by a computer program product in the form of a high-level computer programming language.

36. An interface subsystem computer program product as defined in claim 33 in which said information receiver code devices associated with said at least one test enable said computer to provide a mailbox.

37. An interface subsystem computer program product as defined in claim 33 in which said information receiver code devices associated with said at least one transactor enable said computer to provide a mailbox.

38. An interface subsystem computer program product as defined in claim 33 in which said interface core code devices enable said computer to provide at least one bi-directional information transfer link to each of said at least one test and each of said at least one simulator interface module.

39. An interface subsystem computer program product as defined in claim 38 in which at least one of said at least one bi-directional information transfer links comprises two uni-directional information transfer links for transferring information in opposite directions.

40. An interface subsystem computer program product as defined in claim 39 in which each said uni-directional information transfer link comprises a remote procedure call link.

41. An interface subsystem computer program product as defined in claim 33 in which said at least one said test generates said simulation information in the form of at least one simulation information message packet, said simulation information message packet including simulation system identification information identifying one of said at least one simulation system to receive the simulation information message packet.

42. An interface subsystem computer program product as defined in claim 41 in which each said at least one simulation system has an associated simulation system identifier, said simulation system identification information in each said simulation information message packet identifying the simulation system identifier of the at least one simulation system to receive the simulation information message packet.

43. An interface subsystem computer program product as defined in claim 41 in which said simulation information message packet further includes transactor identification information for identifying one of said at least one transactor to receive the simulation information in said simulation information message packet.

44. An interface subsystem computer program product as defined in claim 43 in which each at least one transactor has an associated transactor identifier, said transactor identification information in each said simulation information message packet identifying the transactor identifier of the at least one transactor to receive the simulation information in said simulation information message packet.

45. An interface subsystem computer program product as defined in claim 43 in which at least one said transactor has a plurality of associated information receivers each identified by an information receiver identifier, said simulation information message packet further including information receiver identification information for identifying one of said plurality of information receivers to receive the simulation information in said simulation information message packet.

46. An interface subsystem computer program product as defined in claim 33 in which said at least one said transactor generates said simulation result information in the form of at least one simulation result information message packet, said simulation result information message packet including test identification information identifying one of said at least one test to receive the simulation result information message packet.

47. An interface subsystem computer program product as defined in claim 46 in which each said at least one test has an associated test identifier, said test identification information in each said simulation information message packet identifying the test identifier of the at least one test to receive the simulation result information message packet.

48. An interface subsystem computer program product as defined in claim 46 in which at least one said test has associated information receiver code devices enabling said computer to provide a plurality of information receivers each identified by an information receiver identifier, said simulation result information message packet further including information receiver identification information for identifying one of said plurality of information receivers to receive the simulation information in said simulation information message packet.

49. An interface subsystem computer program product as defined in claim 33 further comprising a simulation information control code devices for enabling said computer to control the simulation information generator of said at least one test.

50. An interface subsystem computer program product as defined in claim 49 in which said simulation information control code devices enable said computer to control the simulation information generator to provide simulation information for said at least one simulation system when said simulation system is not engaged in a simulation run.

51. An interface subsystem computer program product as defined in claim 50 in which said simulation information control computer program product enables said computer to disable said simulation information generator from providing simulation information for said at least one simulation system when said simulation system is engaged in a simulation run.

52. An interface subsystem computer program product as defined in claim 33 in which said at least one transactor during a simulation run generates supplemental information requests requesting supplemental simulation information from said at least one test, said interface core code devices enabling said computer to transfer said supplemental information request so said at least one test to obtain said supplemental simulation information therefrom.

53. An interface subsystem computer program product as defined in claim 52 in which said at least one test includes a mailbox for storing supplemental simulation information, the interface core code devices enabling said computer to, in response to a supplemental information request from said at least one transactor, retrieve said supplemental simulation information from said mailbox for provision to said at least one transactor.

54. An interface subsystem computer program product as defined in claim 33 further including at least one auxiliary processing module for performing an auxiliary processing operation, said at least one transactor generating an auxiliary processing request, said simulator interface computer program product enabling said computer, in response to an auxiliary processing request enabling said interface core, to enable said auxiliary processing module to perform said auxiliary processing operation.

55. An interface subsystem computer program product as defined in claim 54 in which said auxiliary processing module during an auxiliary processing operation generates auxiliary processed information, the interface core code devices enabling said computer to provide said auxiliary processed information to the simulator interface module of said at least one simulation system for provision to said at least one transactor.

56. An interface subsystem computer program product as defined in claim 33 further comprising a plurality of tests, each including simulation information generation code devices for enabling said computer to providing simulation information to be transferred to said test for use during a simulation run and simulation control indicator generation code devices for enabling said computer to generate a simulation control indicator for controlling said simulation system, said interface subsystem further including simulation control synchronization code devices for enabling the computer to synchronize the tests in providing respective simulation information and simulation control indicators to the at least one simulation system.

57. An interface subsystem computer program product as defined in claim 56 in which the simulation control synchronization code devices enable the tests to provide simulation information to said at least one simulation system prior to a simulation run.

58. An interface subsystem computer program product as defined in claim 57 in which said simulation control synchronization code devices further enable one of the tests to provide a simulation control indicator after all of the tests which are to provide simulation information for a simulation run have provided simulation information.

59. An interface subsystem computer program product as defined in claim 33 in which said at least one test code device provides at least one callback mechanism code device, said interface core code devices enabling said computer to use said callback mechanism code device in transferring said simulation result information to said information receiver code device.

60. An interface subsystem computer program product as defined in claim 59 in which callback mechanism code device is identified by a callback identifier, said at least one test code device enabling said computer to provide said callback identifier for use said interface core code devices, the interface core code devices enabling said computer to use said callback identifier to initiate use of said callback mechanism.

61. An interface subsystem computer program product as defined in claim 60 in which said interface core code devices enables said computer to provide an information transfer link to said at last one test code device, said interface core code devices and said at least one test code device each including an information transfer link establishment module for enabling said computer to establish said information transfer link, said computer using the information transfer link establishment module to provide the callback identifier.

62. An interface subsystem computer program product as defined in claim 33 in which said at least simulation system code device provides at least one callback mechanism, said interface core code devices enabling said computer to use said callback mechanism in transferring said simulation result information to said information receiver code devices.

63. An interface subsystem computer program product as defined in claim 62 in which callback mechanism is identified by a callback identifier, said at least one simulation system code devices enabling said computer to provide said callback identifier for processing by said interface core code devices, the interface core code devices enabling said computer to use said callback identifier to initiate use of said callback mechanism.

64. An interface subsystem computer program product as defined in claim 63 in which said interface core code devices enable said computer to provide an information transfer link to said at last one simulation system code device, said interface core code devices and said at least one simulation system code devices each including an information transfer link establishment module for enabling said computer to establish said information transfer link, said at least one simulation system code devices enabling said computer to use the information transfer link establishment module to provide the callback identifier.

65. A method of controlling a system including at least one simulation system for facilitating simulation of at least one simulation model under control of at least one test, an interface subsystem for allowing said at least one test and said at least one simulation system to transfer information therebetween and for enabling control by said at least one test of said simulation system in simulating said simulation model during a simulation run, said at least one simulation system including at least one transactor for (a) providing information to said simulation model to control the simulation model, (b) pausing a simulation run in response to detection of a selected event, and (c) generating simulation result information, said method comprising the steps of:

A. providing each said at least one test with a simulation information generator for providing simulation information to be transferred to said simulation system for use during a simulation run and a simulation control indicator generator for generating a simulation control indicator for controlling said simulation system, each said at least one test further having associated therewith at least one information receiver for receiving simulation result information;

B. providing each said at least one simulation system:
  i. associating with said at least one transactor an information receiver for receiving simulation information for use by the associated transactor during a simulation run;
  ii. a simulator interface module associated with each said at least one said simulation system for (a) receiving simulation information and providing the received simulation to an information receiver for use by the associated transactor, (b) receiving simulating result information from said at least one transactor to be provided to said at least one test, and (c) controlling said at least one simulation system to initiate a simulation run in response to receipt of a control indicator; and C. providing an interface core for transferring (i) said simulation information from said at least one test to the simulator interface module of a selected one of said at least one simulating system for provision to a selected one of said at least one of said transactor's information receiver for use by a transactor during a simulation run, (ii) said simulation control indicator for controlling a selected one of said at least one simulation system, and (iii) for transferring said simulation result information from said at least one transactor to said information receiver of a selected one of said at least one test.

66. A method as defined in claim 65, in which the at least one simulation model is in the form of a hardware description language description of an electronic circuit.

67. A method as defined in claim 65 in which the at least one test is defined by a computer program product in the form of a high-level computer programming language.

68. A method as defined in claim 65 in which said information receiver of said at least one test comprises a mailbox.

69. A method as defined in claim 65 in which said information receiver of said at least one transactor comprises a mailbox.

70. A method as defined in claim 65 in which said interface core provides at least one bi-directional information transfer link to each of said at least one test and each of said at least one simulator interface module.

71. A method as defined in claim 70 in which at least one of said at least one bi-directional information transfer link comprises two uni-directional information transfer links for transferring information in opposite directions.

72. A method as defined in claim 70 in which each said uni-directional information transfer link comprises a remote procedure call link.

73. A method as defined in claim 65 in which said at least one said test is enabled to generate said simulation information in the form of at least one simulation information message packet, said simulation information message packet including simulation system identification information identifying one of said at least one simulation system to receive the simulation information message packet.

74. A method as defined in claim 73 in which each said at least one simulation system has an associated simulation system identifier, said simulation system identification information in each said simulation information message packet identifying the simulation system identifier of the at least one simulation system to receive the simulation information message packet.

75. A method as defined in claim 73 in which said simulation information message packet further includes transactor identification information for identifying one of said at least one transactor to receive the simulation information in said simulation information message packet.

76. A method as defined in claim 75 in which each at least one transactor has an associated transactor identifier, said transactor identification information in each said simulation information message packet identifying the transactor identifier of the at least one transactor to receive the simulation information in said simulation information message packet.

77. A method as defined in claim 75 in which at least one said transactor has a plurality of associated information receivers each identified by an information receiver identifier, said simulation information message packet further including information receiver identification information for identifying one of said plurality of information receivers to receive the simulation information in said simulation information message packet.

78. A method as defined in claim 65 in which said at least one said transactor generates said simulation result information in the form of at least one simulation result information message packet, said simulation result information message packet including test identification information identifying one of said at least one test to receive the simulation result information message packet.

79. A method as defined in claim 78 in which each said at least one test has an associated test identifier, said test identification information in each said simulation information message packet identifying the test identifier of the at least one test to receive the simulation result information message packet.

80. A method as defined in claim 78 in which at least one said test has a plurality of associated information receivers each identified by an information receiver identifier, said simulation result information message packet further including information receiver identification information for identifying one of said plurality of information receivers to receive the simulation information in said simulation information message packet.

81. A method as defined in claim 65 further comprising the step of controlling the simulation information generator of said at least one test.

82. A method as defined in claim 61 in which said simulation information generator control step includes the step of providing simulation information for said at least one simulation system when said simulation system is not engaged in a simulation run.

83. A method as defined in claim 82 in which said simulation information generator control step includes the step of disabling said simulation information generator from providing simulation information for said at least one simulation system when said simulation system is engaged in a simulation run.

84. A method as defined in claim 65 in which said at least one transactor during a simulation run generates supplemental information requests requesting supplemental simulation information from said at least one test, said interface core being enabled to transfer said supplemental information request so said at least one test to obtain said supplemental simulation information therefrom.

85. A method as defined in claim 84 in which said at least one test includes a mailbox for storing supplemental simulation information, the interface core in response to a supplemental information request from said at least one transactor being enabled to retrieve said supplemental simulation information from said mailbox for provision to said at least one transactor.

86. A method as defined in claim 65 further including at least one auxiliary processing module for performing an auxiliary processing operation, said at least one transactor generating an auxiliary processing request, said simulator interface module in response to an auxiliary processing request enabling said interface core to, in turn, to enable said auxiliary processing module to perform said auxiliary processing operation.

87. A method as defined in claim 86 in which said auxiliary processing module during an auxiliary processing operation generates auxiliary processed information, the interface core being enabled to provide said auxiliary processed information to the simulator interface module of said at least one simulation system for provision to said at least one transactor.

88. A method as defined in claim 65 for use in connection with a system comprising a plurality of tests, each including a simulation information generator for providing simulation information to be transferred to said test for use during a simulation run and a simulation control indicator generator for generating a simulation control indicator for controlling said simulation system, said method further including the step of synchronizing the tests in providing respective simulation information and simulation control indicators to the at least one simulation system.

89. A method as defined in claim 88 in which the simulation control synchronization step includes the step of enabling the tests to provide simulation information to said at least one simulation system prior to a simulation run.

90. A method as defined in claim 89 in which said simulation control synchronization step further includes the step of enabling one of the tests to provide a simulation control indicator after all of the tests which are to provide simulation information for a simulation run have provided simulation information.

91. An interface subsystem as defined in claim 65 in which said at least one test provides at least one callback mechanism, said interface core using said callback mechanism in transferring said simulation result information to said information receiver.

92. An interface subsystem as defined in claim 91 in which callback mechanism is identified by a callback identifier, said at least one test providing said callback identifier to said interface core, the interface core using said callback identifier to initiate use of said callback mechanism.

93. An interface subsystem as defined in claim 92 in which said interface core provides an information transfer link to said at last one test, said interface core and said at least one test each including an information transfer link establishment module for establishing said information transfer link, said at least one test using the information transfer link establishment module to provide the callback identifier.

94. An interface subsystem as defined in claim 65 in which said at least simulation system provides at least one callback mechanism, said interface core using said callback mechanism in transferring said simulation result information to said information receiver.

95. An interface subsystem as defined in claim 94 in which callback mechanism is identified by a callback identifier, said at least one simulation system providing said callback identifier to said interface core, the interface core using said callback identifier to initiate use of said callback mechanism.

96. An interface subsystem as defined in claim 95 in which said interface core provides an information transfer link to said at last one simulation system, said interface core and said at least one simulation system each including an information transfer link establishment module for establishing said information transfer link, said at least one simulation system using the information transfer link establishment module to provide the callback identifier.

\* \* \* \* \*